(12) United States Patent
Rockwell et al.

(10) Patent No.: US 12,740,364 B2
(45) Date of Patent: Sep. 15, 2026

(54) COLD PLATE FOR TRAPPING ETCHING AND DEPOSITION BYPRODUCTS

(71) Applicant: Applied Materials, Inc., Santa Clara, CA (US)

(72) Inventors: Tyler Rockwell, Wakefield, MA (US); Kevin T. Ryan, Wilmington, MA (US); Nicholas Scott Chamberlain, Rockport, MA (US); Costel Biloiu, Rockport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 427 days.

(21) Appl. No.: 18/510,336

(22) Filed: Nov. 15, 2023

(65) Prior Publication Data

US 2025/0157833 A1 May 15, 2025

(51) Int. Cl.
*H10P 72/00* (2026.01)

(52) U.S. Cl.
CPC ................................ *H10P 72/0418* (2026.01)

(58) Field of Classification Search
CPC ............. H10P 72/0418; H10P 72/0434; H10P 72/0471; H10P 72/7618; H01J 2237/022; H01J 2237/31; H01J 37/02; H01J 37/32357; H01J 37/32422; H01J 37/32853; H01J 37/32871; H01J 37/321; H01J 37/32082; H01J 37/3244; H01J 37/32174; C23C 16/507; C23C 16/455; C23C 16/45591; C23C 16/4412; C23C 16/452
USPC ............ 118/723 I, 723 IR, 723 ME, 723 ER; 156/345.48, 345.49, 345.35
See application file for complete search history.

(56) References Cited

U.S. PATENT DOCUMENTS 4,901,667 A * 2/1990 Suzuki .................. C23C 16/452 118/724
6,063,197 A 5/2000 Cox
6,335,293 B1 * 1/2002 Luo ..................... H10P 72/0421 715/825
7,291,360 B2 * 11/2007 Hanawa ................ C23C 16/517 427/248.1
7,695,590 B2 * 4/2010 Hanawa ................ C23C 16/045 156/345.43
2005/0211171 A1 * 9/2005 Hanawa ................ C23C 16/507 118/723 R
2005/0214477 A1 * 9/2005 Hanawa ................ C23C 16/452 427/569
2006/0130758 A1 6/2006 Lohokare
2009/0078871 A1 3/2009 Walther
(Continued)

FOREIGN PATENT DOCUMENTS

KR 200361272 Y1 9/2004

OTHER PUBLICATIONS

International Search Report and Written Opinion for International Application No. PCT/US2024/049419, dated Jan. 10, 2025, 9 pages.

*Primary Examiner* — Rudy Zervigon
(74) *Attorney, Agent, or Firm* — KDW Firm PLLC

(57) ABSTRACT

An ion processing system including a process chamber containing a platen for supporting a semiconductor substrate, the platen mounted on a movable shaft, an ion source connected to the process chamber and adapted to project an ion beam toward the platen, and at least one cooled plate located within the process chamber for collecting byproducts of etching and deposition processes.

18 Claims, 5 Drawing Sheets

(56) References Cited

U.S. PATENT DOCUMENTS

| | | | | |
|---|---|---|---|---|
| 2011/0265821 | A1* | 11/2011 | Tay | H01J 37/32642 118/504 |
| 2016/0240385 | A1 | 8/2016 | Citla | |
| 2018/0237903 | A1* | 8/2018 | Takeuchi | C23C 14/54 |
| 2019/0371574 | A1* | 12/2019 | Hsieh | H01J 37/32449 |
| 2025/0263837 | A1* | 8/2025 | Krishnan | C23C 16/4404 |

* cited by examiner

COLD PLATE FOR TRAPPING ETCHING AND DEPOSITION BYPRODUCTS

FIELD OF THE DISCLOSURE

Embodiments of the present disclosure relate generally to the field of semiconductor device fabrication, and more particularly to devices for mitigating the undesirable effects of etching and deposition byproducts in semiconductor fabrication systems.

BACKGROUND OF THE DISCLOSURE

Semiconductor device fabrication employs many discrete processes for creating desired features in semiconductor substrates. Some of these processes include ion assisted etching and ion beam deposition. In a particular type of semiconductor processing system, an ion source projects an ion beam (or a plurality of ion beamlets) onto a semiconductor workpiece disposed on a platen located in a process chamber. The ion beam may etch the workpiece and/or deposit a material on the workpiece depending on the composition of a gas mixture supplied to the ion source. The platen may be mounted on a movable shaft, and, during etching and deposition processes, the shaft may be moved vertically to scan the workpiece in front of the ion beam. In this manner, targeted etching and/or deposition may be achieved.

In the above-described system, the movable shaft extends through a hole in the floor of the process chamber. A flexible O-ring surrounds the shaft at the juncture of the shaft and the floor to allow vertical translation of the shaft while also sealing the juncture to maintain separation between a high vacuum environment within the process chamber and the external atmosphere. The high vacuum environment within the process chamber is accomplished using turbomolecular pumps mounted to a wall of the process chamber.

During etching processes, etching radicals in the ion beam may interact with the semiconductor workpiece to form volatile byproducts. Some of these byproducts may migrate through the process chamber toward the turbomolecular pumps. Similarly, during deposition processes, some of the deposition species in the ion beam may not deposit on the semiconductor workpiece and may also migrate through the process chamber toward the turbomolecular pumps. These byproducts of etching and deposition may stick to, or settle on, various surfaces within the process chamber. Over time, this may result in the formation of thin films on such surfaces, including on the surface of the movable shaft and on the O-ring at the juncture of the shaft and the floor of the process chamber. These films can impede the movement of the shaft, adversely affecting the constancy of the scanning speed of the platen and resulting in process inconsistencies on the semiconductor workpiece (e.g., unintended and inaccurate etching and deposition). Furthermore, the deposited films may compromise the seal provided by the O-ring, resulting in leaks in the process chamber.

With respect to these and other considerations, the present improvements may be useful.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

An ion processing system in accordance with an embodiment of the present disclosure may include a process chamber containing a platen for supporting a semiconductor substrate, the platen mounted on a movable shaft, an ion source connected to the process chamber and adapted to project an ion beam toward the platen, and at least one cooled plate located within the process chamber for collecting byproducts of etching and deposition processes.

A process chamber of an ion processing system in accordance with an embodiment of the present disclosure may include a platen for supporting a semiconductor substrate, the platen mounted on a movable shaft, and at least one cooled plate located within the process chamber for collecting byproducts of etching and deposition processes.

BRIEF DESCRIPTION OF THE DRAWINGS

By way of example, various embodiments of the disclosed techniques will now be described, with reference to the accompanying drawings, wherein.

DETAILED DESCRIPTION

Figure 1A:
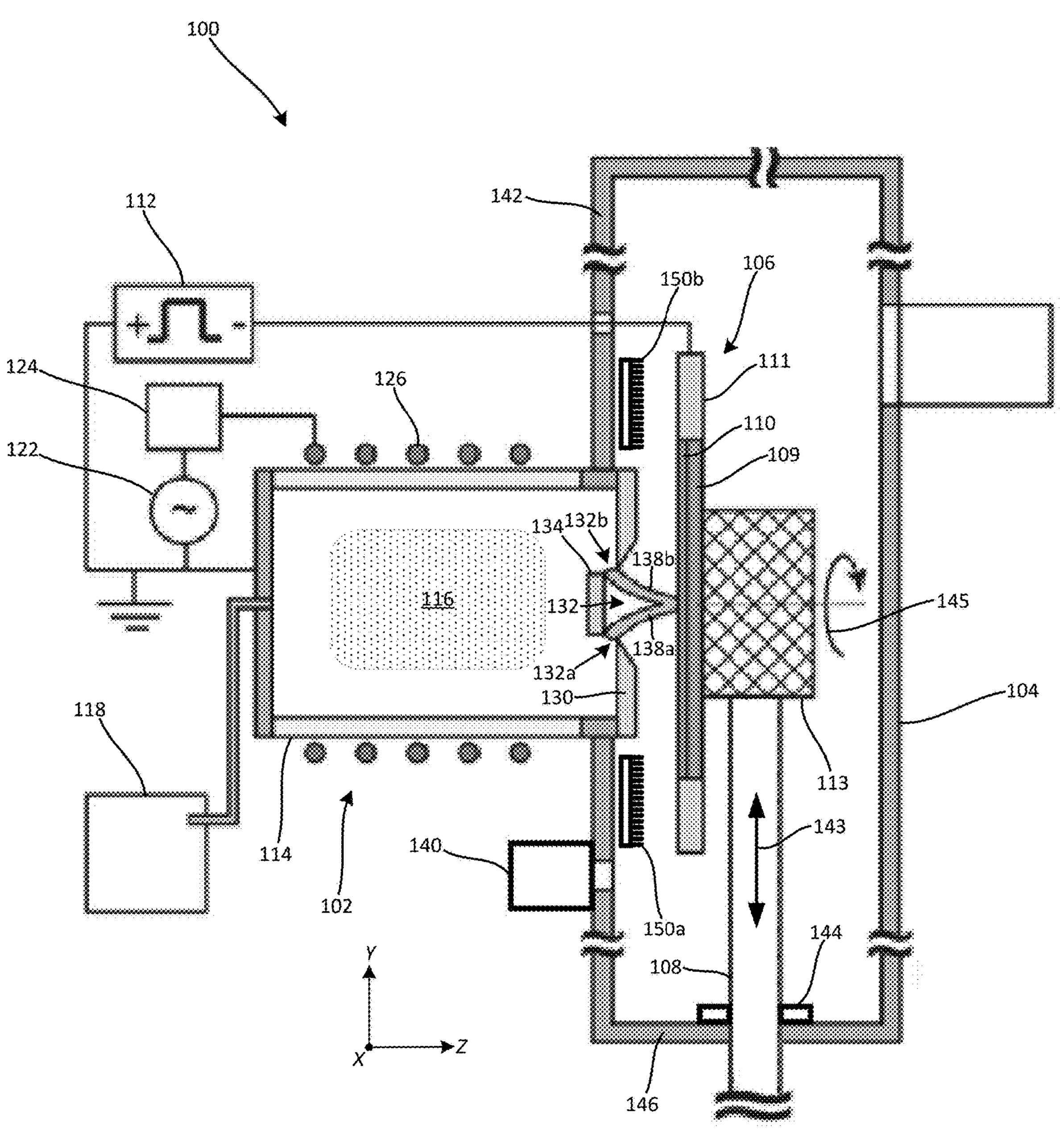
FIG. 1A is a schematic cross-sectional view illustrating an etching and deposition system in accordance with an embodiment of the present disclosure.

The present embodiments will now be described more fully hereinafter with reference to the accompanying drawings, wherein some embodiments are shown. The subject matter of the present disclosure may be embodied in many different forms and is not to be construed as limited to the embodiments set forth herein. These embodiments are provided so this disclosure will be thorough and complete, and will convey certain exemplary aspects of the subject matter to those skilled in the art. In the drawings, like numbers refer to like elements throughout.

Figure 1B:
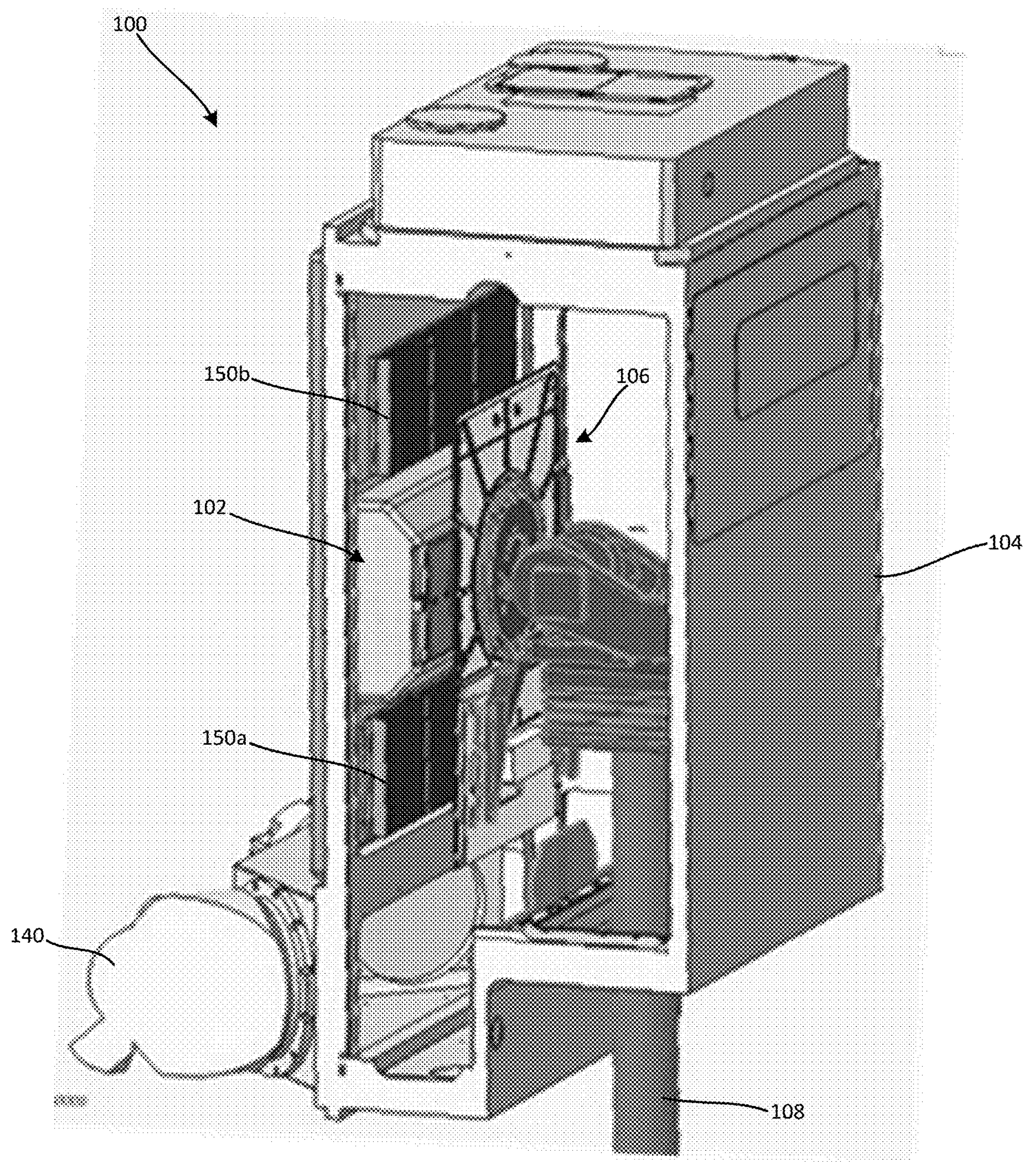
FIG. 1B is a perspective cut-away view illustrating the system shown in FIG. 1.

Referring to FIGS. 1A and 1B, there are shown a schematic cross-sectional view and a perspective, cut-away view illustrating an interior of ion processing system (hereinafter "the system 100") consistent with embodiments of the present disclosure. The system 100 may generally include an ion source 102 connected to a process chamber 104. The process chamber 104 may contain a platen assembly 106 mounted on a movable shaft 108 for supporting and scanning a semiconductor workpiece 110 (hereinafter "the workpiece 110") in front of the ion source 102. The platen assembly 106 may include a platen 109 supporting a rear surface of the workpiece 110, a halo 111 radially surrounding the platen 109 and the workpiece 110, and a base 113 coupling the platen 109 to the movable shaft 108, for example. The present disclosure is not limited in this regard. The processing system 100 may further include a pulsed voltage supply 112 electrically coupled to a plasma chamber 114 of the ion source 102 and to the workpiece 110 (or to the platen assembly 106) for generating a bias voltage therebetween. As such, the system 100 may act as an ion beam processing system to generate ion beams for processing the workpiece 110 (e.g., to perform etching and deposition processes on the workpiece 110) as further described below.

The ion source 102 of the system 100 may be configured to generate a plasma 116 from a mixture of gaseous species supplied to the plasma chamber 114 by a gas manifold 118. For example, the plasma chamber 114 may be referenced to ground potential, and the ion source 102 may include a radio frequency (RF) generator 122 and a RF matching network 124 coupled to a RF antenna 126 surrounding the plasma chamber 114 for igniting the gaseous species and sustaining the plasma 116 in a manner familiar to those of ordinary skill in the art. The present disclosure is not limited in this regard.

The ion source 102 may include an extraction plate 130 enclosing an end of the plasma chamber 114 proximate the platen assembly 106. The extraction plate 130 may define an extraction aperture 132 elongated in a direction parallel to the X-axis of the illustrated Cartesian coordinate system in FIG. 1A. The extraction aperture 132 may allow ions from the plasma chamber 114 to pass through to the workpiece 110 as further described below. The ion source 102 may further include a beam blocker 134 mounted to the extraction plate 130 adjacent the extraction aperture 132. When a negative voltage is applied to the workpiece 110 (or to the platen assembly 106) with respect to the plasma chamber 114 in the presence of the plasma 116, plasma menisci may be formed in first and second slits (sub-apertures) 132*a*, 132*b* between the beam blocker 134 and the extraction plate 130 (i.e., below and above the beam blocker 134). The beam blocker 134 may be vertically centered (i.e., centered in a direction parallel to the Y-axis of the illustrated Cartesian coordinate system in FIG. 1A) relative to the extraction aperture 132 to facilitate the formation and extraction of two symmetrical, angled ion beamlets 138*a*, 138*b* directed toward the workpiece 110.

An interior of the process chamber 104 may be held at high vacuum (better than $10^{-4}$ Torr) by one or more turbomolecular pumps 140 mounted to a wall 142 of the process chamber 104. A flexible O-ring 144 may surround the movable shaft 108 at a juncture of the movable shaft 108 and a floor 146 of the process chamber 104 to allow vertical translation of the movable shaft 108 while also sealing the juncture to maintain separation between the vacuum environment within the process chamber 104 and the external atmosphere.

During processing of the workpiece 110, the ion source 102 may be operated to project the ion beamlets 138*a*, 138*b* onto the front surface of the workpiece 110 while the movable shaft 108 is translated up and down (as indicated by arrow 143) to vertically scan the workpiece 110 in front of the ion source 102. The workpiece 110 may also be rotated by rotating the platen 109 about a central axis (as indicated by arrow 145). Thus, desired portions of the workpiece 110 may be exposed to the ion beamlets 138*a*, 138*b* in a controlled manner to achieve highly targeted processing. In various processes, the gaseous species supplied to the plasma chamber 114 may be selected to generate reactive ions and etching radicals to perform ion assisted etching of the workpiece 110. Such gaseous species may include, and are not limited to, fluorocarbon monomers (e.g., $CF_4$, $C_2F_6$, $C_3F_8$). In other processes the gaseous species supplied to the plasma chamber 114 may be selected to produce polymeric species to effectuate ion beam deposition on the workpiece 110. Such gaseous species may include, and are not limited to, hydrogen ($H_2$), methane ($CH_4$), and/or hydrogenated fluorocarbons ($CH_3F$, $CHF_3$). These gaseous mixtures may be diluted with other gases such as $N_2$, $O_2$, or Ar. The etching and polymerization gaseous species may be supplied to the plasma chamber 114 simultaneously or they may be repeatedly alternated to perform etching and deposition processes on the workpiece 110 in a cyclical manner. The present disclosure is not limited in this regard.

When an etching process is performed on the workpiece 110, ions contained in the ion beamlets 138*a*, 138*b* may bombard the workpiece 110 and may generate dangling bonds at the surface of the workpiece 110. Then etching radicals coming from the ion source 102 through the first and second slits 132*a* and 132*b* may interact with the bombarded surface to form volatile byproducts. Thus, a chemical etching process is a conjugated interaction of the ion beamlets 138*a*, 138*b* and etching radicals with the surface of the workpiece 110. Simultaneously, some polymeric species may deposit on certain portions of the workpiece 110, thus protecting such portions from ion bombardment. In this fashion a strongly anisotropic etching process can take place. Some of the etching byproducts and/or unreacted polymeric species may migrate through the process chamber 104, such as toward the turbomolecular pump 140 and subsequently are pumped away. Other byproducts of etching and deposition may stick to, or settle on, various surfaces within the process chamber 104. Over time, this may result in the formation of thin films (e.g., fluorocarbon polymeric films) on such surfaces, including on the surface of the movable shaft 108 and on the O-ring 144 at the juncture of the movable shaft 108 and the floor 146 of the process chamber 104. These films can change the coefficient of friction between the movable shaft 108 and the O-ring 144, impeding smooth translation of the movable shaft 108 and adversely affecting the constancy of the scanning speed of the platen assembly 106 and the workpiece 110. This may result in process non-uniformities on the workpiece 110 (e.g., unintended and unequal etching profile on the workpiece surface). Furthermore, the deposited films may compromise the seal provided by the O-ring 144, resulting in leaks in the process chamber 104, which may compromise the etching process.

In order to address the above-described problem, the system 100 may be provided with one or more cooled plates 150*a*, 150*b* located within the process chamber 104. For example, a first cooled plate 150*a* may be installed on a wall of the process chamber 104 below the ion source 102, and a second cooled plate 150*b* may be installed on a wall of the process chamber 104 above the ion source 102. Since the interior of the process chamber 104 is held at high vacuum (e.g., better than $10^{-4}$ Torr) the motion of gaseous species in the process chamber 104 may obey a molecular flow regime, meaning molecules will travel in a straight line until they intersect a surface. Thus, the first and second cooled plates 150*a*, 150*b* may be placed at locations having a maximum probability of being intersected by the trajectories of byproducts ejected from the surface of the workpiece 110. It has been found that the rate of deposition of the byproducts described above (i.e., etching and deposition byproducts) on a surface increases exponentially as the temperature of the surface is decreased. Thus, if the first and second cooled plates 150*a*, 150*b* are kept at a temperature lower than the temperatures of other surfaces within the process chamber 104, most of the undesirable byproducts ejected from the surface of the workpiece 110 may collect on the first and second cooled plates 150*a*, 150*b* rather than on surfaces where the accumulation of byproducts could be detrimental to the operation of the system 100 (e.g., on the surface of the movable shaft 108 and on the O-ring 144). In a non-limiting example, the first and second cooled plates 150*a*, 150*b* may be cooled to a temperature slightly below room temperature (e.g., a temperature in a range of 5 degrees Celsius to 20 degrees Celsius).

Figure 2A:
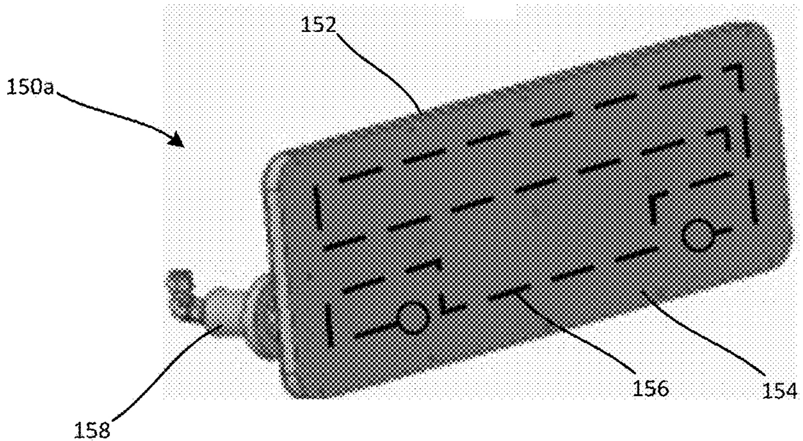
FIG. 2A is a front perspective view illustrating a cooled plate in accordance with an embodiment of the present disclosure.
Figure 2B:
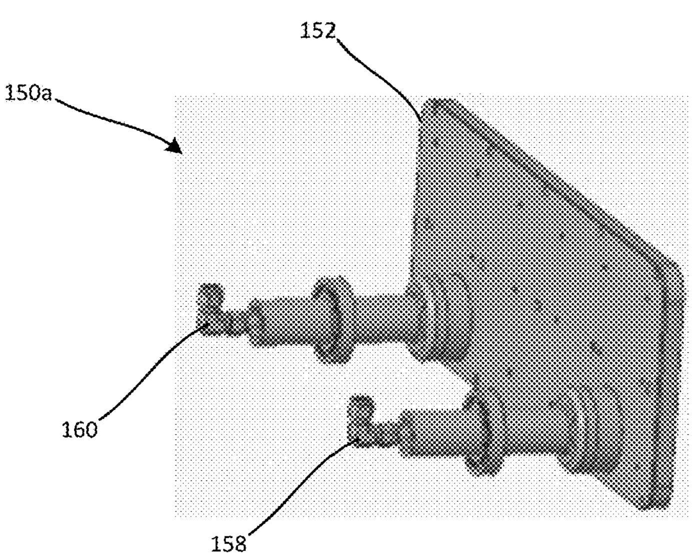
FIG. 2B is a rear perspective view illustrating the cooled plate of FIG. 2A.

Referring now to FIGS. 2A and 2B, a front perspective view and a rear perspective view illustrating the first cooled plate 150*a* in isolation are shown, respectively. The first cooled plate 150*a* may be substantially identical to the second cooled plate 150*b* shown in FIG. 1. Thus, the following description of the first cooled plate 150*a* shall also apply to the second cooled plate 150*b* shown in FIG. 1, as well as to additional cooled plates discussed below.

The first cooled plate 150*a* may include a generally cuboid, tile-shaped main body 152 formed of a material having good thermal conductivity (e.g., aluminum, stainless steel, etc.). The main body 152 may have a substantially planar front surface 154 and may have a cooling line 156 extending through an interior thereof. The cooling line 156 may be a tube, hose, conduit, etc. The ends of the cooling line 156 may be coupled to a fluid inlet 158 and a fluid outlet 160 extending from a rear surface of the main body 152. When the first cooled plate 150*a* is installed in the system 100, the fluid inlet 158 and the fluid outlet 160 may be coupled to a cooled fluid source such as a chiller (not shown). During operation of the system 100, a cooling fluid may be pumped form the fluid source through the cooling line 156, thus cooling the main body 152.

Figure 2C:
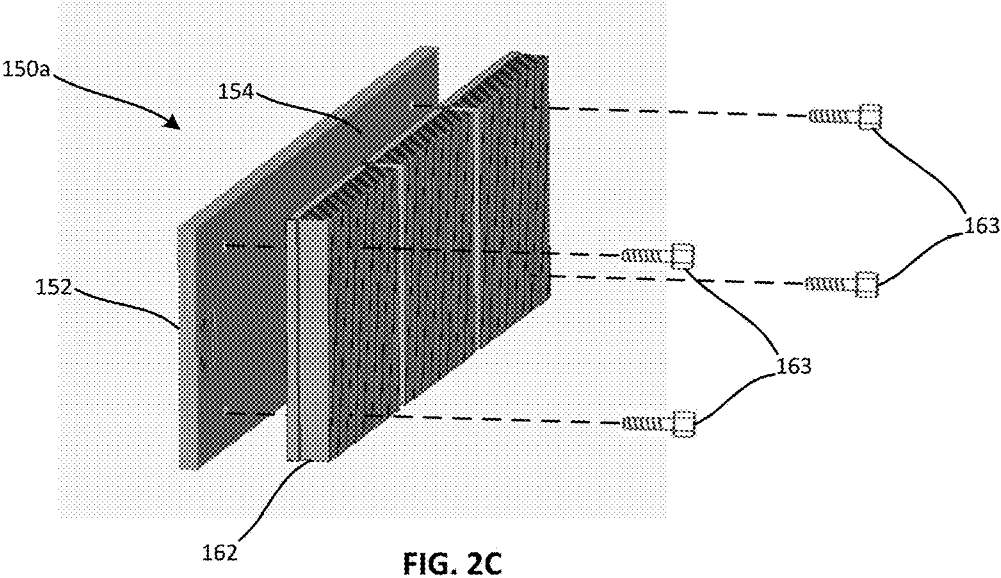
FIG. 2C is an exploded view illustrating the cooled plate of FIG. 2A with a removable heatsink.

In various embodiments, and with reference to FIG. 2C, the first cooling plate 150*a* may further include a heat sink 162 removably mounted to the front surface 154 of the main body 152, such as by mechanical fasteners 163. The heat sink 162 may have a plurality of fins or ridges and may be formed of a metal such as aluminum or nickel. The present disclosure is not limited in this regard. During operation of the system 100, etching and deposition byproducts may accumulate on the heat sink 162 instead of on the first cooling plate 150*a*. After a quantity of by products have accumulated on the heat sink 162, the heat sink 162 may be removed from the first cooling plate 150*a* and may be cleaned or disposed of. The heat sink 162 may then be reinstalled or replaced. The removable heat sink 162 thus eliminates the time and inconvenience associated with cleaning the first cooling plate 150*a* within the process chamber 104. In various embodiments, the heat sink 162 may be coated with a film of barrier thin alumina (BTA) or other inert or non-reactive sealing material to prevent metal particulate from the heat sink 162 from being released into, and contaminating, the process chamber 104. The present disclosure is not limited in this regard.

Figure 3A:
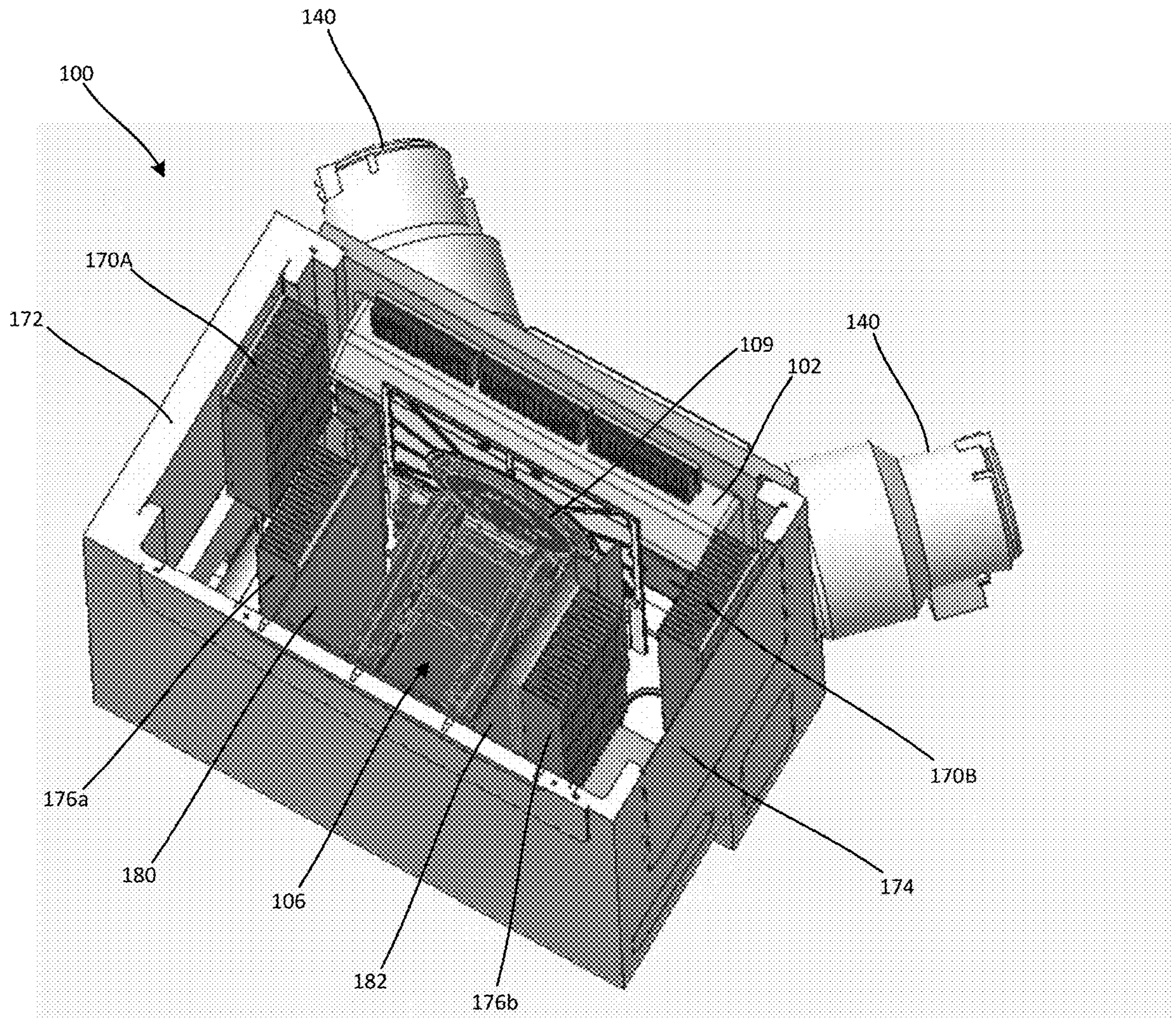
FIG. 3A is a perspective cut-away view illustrating an etching and deposition system in accordance with another embodiment of the present disclosure.
Figure 3B:
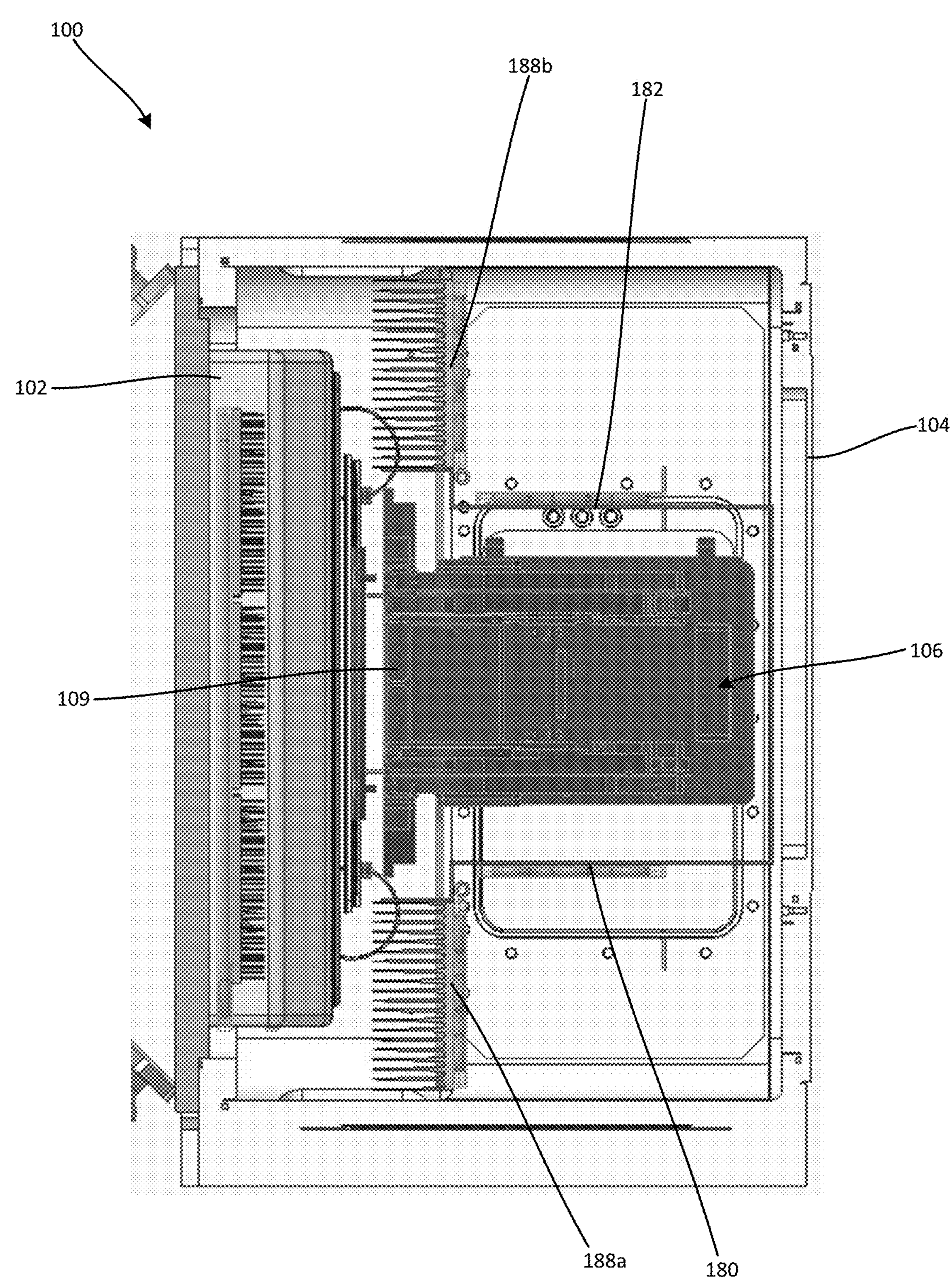
FIG. 3B is a cross-sectional top view illustrating an etching and deposition system in accordance with another embodiment of the present disclosure.

As described above and as shown in FIGS. 1A and 1B, the system 100 may include the first and second cooled plates 150*a*, 150*b* mounted on the wall 142 of the process chamber 104 below and above the ion source 102. In various alternative embodiments of the system 100, the first and second cooled plates 150*a*, 150*b*, and/or additional cooled plates, may be installed at various other locations within the process chamber 104 for further improving the ability of the system 100 to trap unwanted byproducts. For example, referring to FIG. 3A, an embodiment of the system 100 is shown wherein cooled plates 170*a*, 170*b* may be mounted to opposing sidewalls 172, 174 of the process chamber 104 in a perpendicular orientation relative to the platen 109. Additionally or alternatively, the system 100 may include first and second shaft enclosure walls 180, 182 surrounding and partially enclosing the movable shaft 108 (the movable shaft 108 is not within view in FIG. 3A), wherein cooled plates 176*a*, 176*b* may be mounted to outwardly-facing surfaces of the first and second shaft enclosure walls 180, 182, respectively (i.e., mounted in a confronting relationship with the sidewalls 172, 174 of the process chamber 104). Still further, and with reference to FIG. 3B, an embodiment of the system 100 is contemplated wherein cooled plates 188*a*, 188*b* may be mounted to outwardly facing surfaces of the first and second shaft enclosure walls 180, 182 in perpendicular orientations therewith to flank the sides of the platen 109, parallel with the front surface of the platen 109 and in a confronting relationship with the ion source 102. The present disclosure is not limited in this regard.

Those of skill in the art will appreciate the numerous benefits provided by the embodiments of the present disclosure. For example, as described above, the cooled plates of the present disclosure may attract and collect byproducts of etching and deposition processes performed in the process chamber 104, thus preventing the accumulation of such byproducts on surfaces where such accumulation could be detrimental to the operation of the system 100 (e.g., on the surface of the movable shaft 108 and on the O-ring 144). Furthermore, since the cooled plates are provided with removable heat sinks, the cooled plates can be easily serviced (e.g., the heat sinks can be removed and replaced or cleaned and reinstalled) without significant downtime normally associated with cleaning accumulated byproducts out of a process chamber. The throughput of the system 100 is thus improved relative to conventional ion processing systems.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. An ion processing system comprising:

a process chamber containing a platen for supporting a semiconductor substrate, the platen mounted on a movable shaft;

an ion source connected to the process chamber and adapted to project an ion beam toward the platen; and at least one cooled plate located within the process chamber for collecting byproducts of etching and deposition processes, wherein the cooled plate comprises a main body and a heat sink removably mounted to a front surface of the main body.

2. The ion processing system of claim 1, wherein the at least one cooled plate is mounted to a wall of the process chamber, adjacent the ion source and in a confronting relationship with the platen.

3. The ion processing system of claim 1, wherein the at least one cooled plate comprises a first cooled plate and a second cooled plate, wherein the first cooled plate is mounted to a wall of the process chamber on a first side of the ion source and the second cooled plate is mounted to the wall of the process chamber on a second side of the ion source opposite the first side.

4. The ion processing system of claim 1, wherein the at least one cooled plate comprises: a main body; and a cooling line extending through the main body for circulating a cooling fluid through the main body.

5. The ion processing system of claim 1, wherein the heat sink is coated with a film of barrier thin alumina.

6. The ion processing system of claim 1, further comprising a first shaft enclosure wall and a second shaft enclosure wall surrounding and partially enclosing the movable shaft, wherein the at least one cooled plate comprises a first cooled plate and a second cooled plate, wherein the first cooled plate is mounted to an exterior surface of the first shaft enclosure wall and the second cooled plate is mounted to an exterior surface of the second shaft enclosure wall.

7. The ion processing system of claim 6, wherein the first cooled plate and the second cooled plate are oriented perpendicular to the platen.

8. The ion processing system of claim 6, wherein the first cooled plate and the second cooled plate are oriented parallel to the platen and in a confronting relationship with the ion source.

9. The ion processing system of claim 1, wherein the at least one cooled plate is coupled to a cooled fluid source located outside of the process chamber.

10. A process chamber of an ion processing system, the process chamber comprising:

a platen for supporting a semiconductor substrate, the platen mounted on a movable shaft; and at least one cooled plate located within the process chamber for collecting byproducts of etching and deposition processes, wherein the cooled plate comprises a main body and a heat sink removably mounted to a front surface of the main body.

11. The process chamber of claim 10, wherein the at least one cooled plate is mounted to a wall of the process chamber in a confronting relationship with the platen.

12. The process chamber of claim 10, wherein the at least one cooled plate comprises:

a first cooled plate mounted to a vertical axis along a wall of the process chamber above, and in a confronting relationship with, the platen; and a second cooled plate mounted to the vertical axis along the wall of the process chamber below, and in a confronting relationship with, the platen.

13. The process chamber of claim 10, wherein the at least one cooled plate comprises:

a main body; and a cooling line extending through the main body for circulating a cooling fluid through the main body.

14. The process chamber of claim 10, wherein the heat sink is coated with a film of barrier thin alumina.

15. The process chamber of claim 10, further comprising a first shaft enclosure wall and a second shaft enclosure wall surrounding and partially enclosing the movable shaft, wherein the at least one cooled plate comprises a first cooled plate and a second cooled plate, wherein the first cooled plate is mounted to an exterior surface of the first shaft enclosure wall and the second cooled plate is mounted to an exterior surface of the second shaft enclosure wall.

16. The process chamber of claim 15, wherein the first cooled plate and the second cooled plate are oriented perpendicular to the platen.

17. The process chamber of claim 15, wherein the first cooled plate and the second cooled plate are oriented parallel to the platen.

18. The process chamber of claim 10, wherein the at least one cooled plate is coupled to a cooled fluid source located outside of the process chamber.

* * * * *